United States Patent [19]

Torii et al.

[11] 4,393,373

[45] Jul. 12, 1983

[54] PIEZOELECTRIC AUDIBLE SOUND GENERATOR

[75] Inventors: Michihiro Torii, Hamamatsu; Kohei Hirukawa, Kosai; Hiroshi Urata, Aichi; Shinichi Suzuki, Hamamatsu, all of Japan

[73] Assignee: Fuji Electrochemical Co., Ltd., Tokyo, Japan

[21] Appl. No.: 243,743

[22] Filed: Mar. 16, 1981

[51] Int. Cl.$^3$ .......................... G08B 3/00; H01L 41/04

[52] U.S. Cl. .......................... 340/384 E; 340/384 R; 340/692; 367/167; 367/172; 116/137 R; 116/DIG. 19; 179/110 A; 331/78; 310/322

[58] Field of Search ............... 340/384 E, 384 R, 388, 340/392, 393, 397, 404, 692; 367/157, 164, 162, 167, 172; 116/137 R, 137 A, DIG. 19; 310/311, 322, 334, 365, 366, 316, 324; 331/64, 78; 332/26; 179/110 A

[56] References Cited

U.S. PATENT DOCUMENTS

| | | | |
|---|---|---|---|
| 3,815,129 | 6/1974 | Sweany | 340/388 |
| 4,275,388 | 6/1981 | Hornung | 340/384 E |
| 4,303,908 | 12/1981 | Enemark et al. | 340/384 R |

*Primary Examiner*—Donnie L. Crosland
*Attorney, Agent, or Firm*—Fleit, Jacobson & Cohn

[57] ABSTRACT

A piezoelectric audible sound generator having a feedback type piezoelectric transducer, an amplifier, and a phase compensator for adjusting the phase shift due to the combination of a bias resistance of the amplifier and equivalent capacitance of the piezoelectric transducer.

5 Claims, 9 Drawing Figures

PIEZOELECTRIC AUDIBLE SOUND GENERATOR

BACKGROUND OF THE INVENTION

The present invention relates to a noise making device using a piezoelectric transducer, and more particularly to a piezoelectric audible signal generator incorporating a three-electrode piezoelectric transducer, an amplifier, a phase shifter and a feedback loop.

A known, typical piezoelectric noise making device has, as illustrated in FIG. 1, a three-electrode piezoelectric transducer $X_1$ having a resilient thin metal plate 1 as a ground electrode, piezoelectric plate 2 and driving electrode 3 wherein the driving electrode 3 is connected to a collector of a transistor $Q_1$ while a feedback electrode 4 is connected through a resistor $R_3$ to a base of the transistor $Q_1$.

However, the known noise making device using the feedback type piezoelectric transducer produces a less sound pressure than the expected value which is inferred theoretically from the case of a two-electrode piezoelectric transducer without a feedback electrode. An attempt has been made to overcome the disadvantage by utilizing a transformer to heighten a voltage of a power supply, which, however, directs to a large scale of the device and does not meet with industrial, commercial requirements.

SUMMARY OF THE INVENTION

An object of the present invention is to provide an improved piezoelectric noise making device which permits to exhibit its maximum noise making performance.

Another object of the present invention is to provide a new piezoelectric noise making device which can produce a higher sound pressure at a low driving electric voltage than the conventional device can.

The present invention is based upon a finding from various experiments that an unsuitable phase rotation of a signal is produced in the feedback circuit from the piezoelectric transducer to the amplifier. Theoretically, a driving signal applied to a driving electrode 3 of a feedback type piezoelectric transducer $X_1$ and a sensed signal from its feedback electrode 4 is about 180° as far as the transducer itself is concerned and a phase difference between a base input voltage and a collector output voltage of a transistor $Q_1$ is 180°. It would be understood from the above that a device including the piezoelectric transducer, the transistor amplifier, and a feedback circuit connected between the feedback electrode and the base of the transistor produces an oscillating sound at a frequency in the vicinity of an inherent resonance frequency of the feedback type piezoelectric transducer.

Actually, however, there is produced an unsuitable phase shift of the feedback signal by a base bias resistor $R_3$ of the transistor $Q_1$ and an equivalent capacitance of the piezoelectric transducer $X_1$, resulting in that the noise making device oscillates at a frequency $f_1$ which is shifted too much from the inherent resonance frequency $f_0$. Consequently, a practical sound pressure is limited to a value much lower than the peak value $P_0$ of sound pressure at the inherent resonance condition.

Briefly, a piezoelectric audible sound generator according to the present invention has a self oscillator having a feed-back type piezoelectric transducer and an amplifier, and a phase compensator for adjusting the phase shift due to the combination of a bias resistance of the amplifier and equivalent capacitance of the piezoelectric transducer.

Additional objects and features of the present invention will become apparent from the detailed description of a preferred embodiment thereof which will be made with reference to the accompanying drawings.

BRIEF DESCRIPTION OF THE DRAWINGS

FIGS. 3 through 6(B) show a piezoelectric noise making device according to the present invention, in which:

FIG. 3 is a block diagram of an inventive device, showing a base circuit structure of the inventive piezoelectric noise making device, FIG. 5 is a circuit diagram specifically illustrating a preferred structure of the inventive piezoelectric noise making device, and FIGS. 6(A) and 6(B) are graphs showing phase angle relative to a frequency, and sound pressure relative to a frequency, respectively.

DETAILED DESCRIPTION OF THE INVENTION

Figure 1:
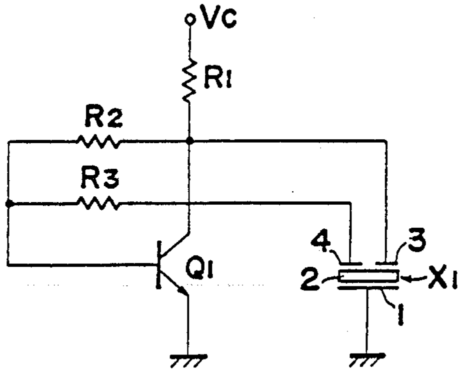
FIG. 1 (PRIOR ART)
FIG. 1 is a circuit diagram illustrating a typical, known piezoelectric noise making device.
Figure 2:
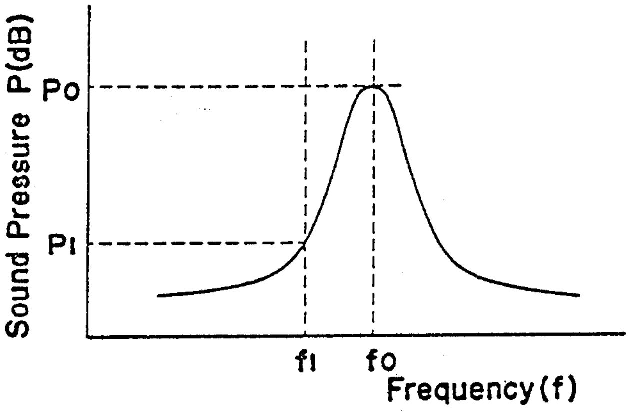
FIG. 2 is a graph of a sound pressure characteristics of a feedback type piezoelectric transducer relative to a frequency, showing an inherent resonance frequency $f_0$ of the transducer.
Figure 3:
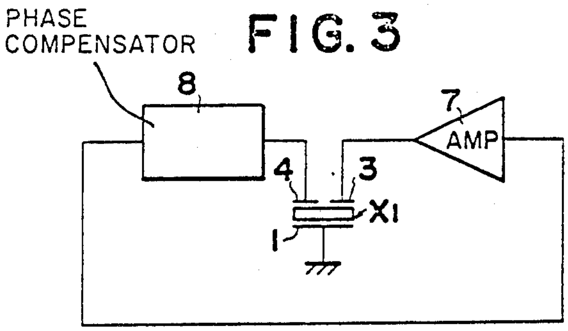
Figure 4A:
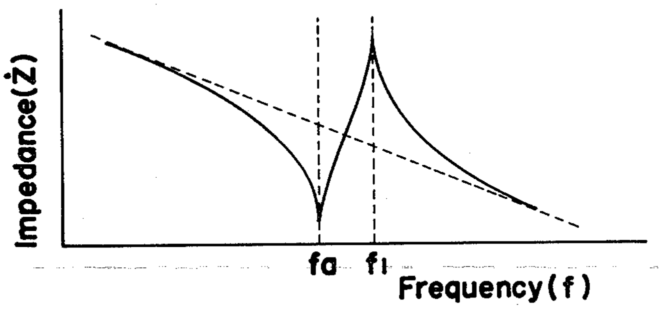
FIGS. 4(A), 4(B) and 4(C) are graphs showing characteristics of an impedance, phase angle and sound pressure, respectively, of a feedback type piezoelectric transducer employed in the inventive piezoelectric noise making device.
Figure 4B:
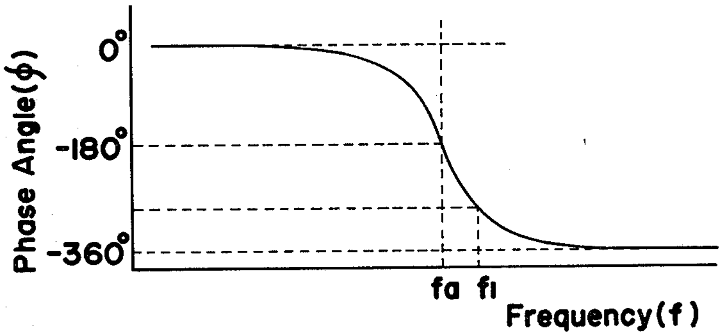
Figure 4C:
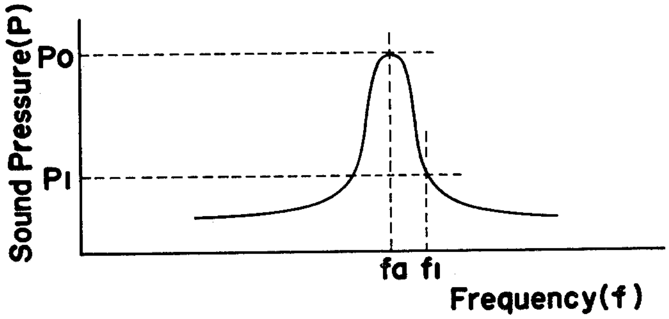

A feedback type piezoelectric transducer applicable to the inventive device is known as disclosed in U.S. Pat. No. 3,815,129, and a detailed description will not be made for this reason. The piezoelectric transducer has characteristics of impendance, phase angle and sound pressure as illustrated in FIGS. 4(A), 4(B) and 4(C), respectively. The piezoelectric transducer $X_1$ has a resonance frequency $f_r$ represented by an LC series resonance equivalent circuit, and an anti-resonance frequency $f_a$ represented by an LC parallel resonance equivalent circuit, wherein a minimum value corresponds to a resonance frequency $f_r$ while a maximum value corresponds to the anti-resonance frequency $f_a$ in respect of an impedance characteristic curve. Besides, in respect of the feedback type piezoelectric transducer $X_1$, a phase difference between the driving signal applied to the driving electrode 3 and the sensing signal from the feedback electrode 4 is 180° at the anti-resonance frequency $f_a$. The self-oscillation circuit as is shown in FIG. 1 is of constant currency to permit the sound pressure P to become maximum at the anti-resonance frequency $f_a$, but the phase difference due to the combination between the driving signal applied to the driving electrode and the feedback signal fed back to the amplifier imput is not full 180° due to the combination of the base bias resistance of the transistor amplifier and the equivalent capacitance of the transducer. Accordingly the phase difference of the driving electrode signal and the feedback electrode signal will become 180° plus additional angle, and the resultant sound pressure becomes a value $P_1$ which is much less than the maximum value $P_o$, as shown in FIG. 4(C).

Figure 5:
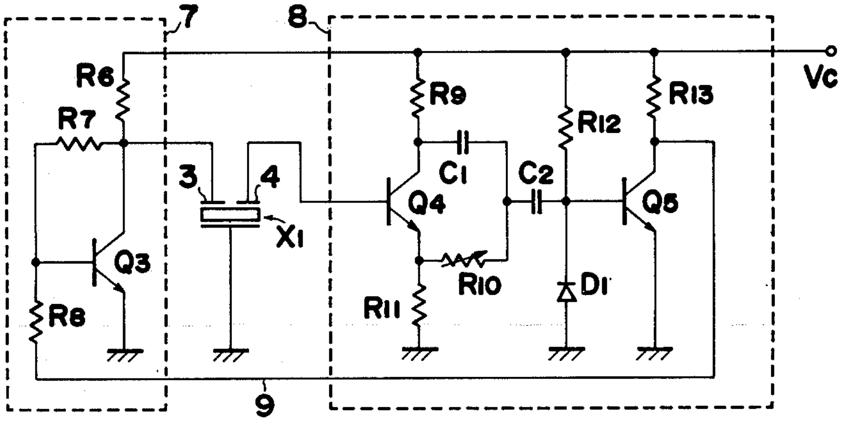

According to the present invention, a phase compensating circuit 8 is provided to adjust the phase difference, namely the aforementioned additional angle, so that the noise making device can oscillate at a frequency of a maximum sound pressure. A desired, specific structure of the inventive device is shown in FIG. 5, in which reference numerals 7 and 8 designate an amplifier and phase compensator, respectively.

A collector of the transistor $Q_3$ is connected through a collector resistor $R_6$ to a power source $V_c$ and also to a driving electrode 3 of the feedback type piezoelectric transducer $X_1$. An emitter of the transistor $Q_3$ is grounded, and a base thereof is connected through a base biasing resistor $R_7$ to the collector thereof. A feedback electrode 4 of the piezoelectric transducer $X_1$ is connected to a base of a transistor $Q_4$, while its collector is connected through a collector resistor $R_9$ to the power source $V_c$ and also to a base of a transistor $Q_5$ through capacitors $C_1$ and $C_2$. An emitter of the transistor $Q_4$ is grounded through an emitter resistor $R_{11}$ and is also connected between the capacitors $C_1$ and $C_2$ by way of a semi-fixed (trimmer) resistor $R_{10}$. A base of the transistor $Q_5$ is connected through a base biasing resistor $R_{12}$ to the power source $V_c$ is also grounded by way of a diode $D_1$. An emitter of the transistor $Q_5$ is grounded while a collector is connected through a collector resistor $R_{13}$ to the power source and also to the transistor $Q_3$ through a feedback loop 9 and a base resistor $R_8$.

An electric signal obtained at the feedback electrode 4 of the piezoelectric transducer is fed back so that it becomes 180° out of phase with the driving voltage at a base of the transistor $Q_3$ by way of the phase compensator 8 which has a network of resistors and capacitors. At this time, the phase is adjusted by the semi-fixed resistor $R_{10}$ which is connected to the transistor $Q_4$. This means that adjustment of the resistor $R_{10}$ permits the phase difference between the driving voltage applied to the driving electrode 3 and the signal obtained at the feedback electrode lies within the range of from 170° to 190°.

Figure 6A:
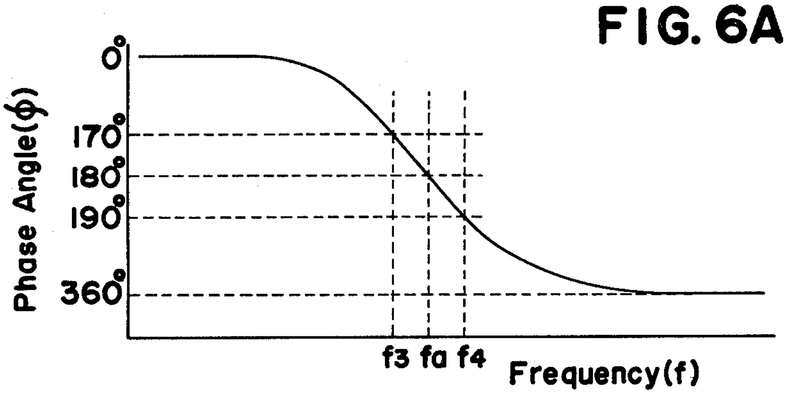
Figure 6B:
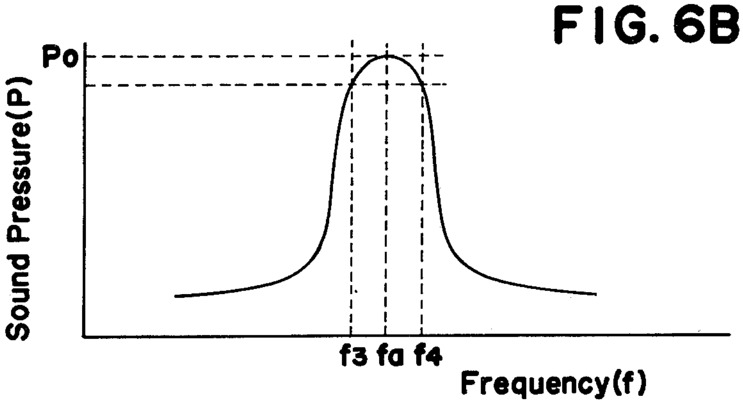

FIGS. 6(A) and 6(B) show a phase angle and a sound pressure characteristic when the resistance $R_{10}$ is varied. When the phase difference is negative 180°, oscillating frequency will coincide with an anti-resonance frequency $f_a$ of the feedback type piezoelectric transducer $X_1$, and the sound pressure becomes a maximum value $P_o$. Within the phase difference range of from 170° to 190°, the oscillating frequency shifts within the range of from $f_3$ to $f_4$, and it will be understood from the drawing that the sound pressure immediately lowers at the outside of the range. In other words, a practical, high sound pressure can be obtained within the range of from $f_3$ to $f_4$, and the semi-fixed resistor $R_{10}$ should be adjusted so that a phase difference lies within the range of from 170° to 190°. It will be understood from FIGS. 6(A) and 6(B) that it is the most practicable that the semi-fixed resistor be adjusted to the phase difference of 180°.

Comparing the inventive device with the well known device of self oscillation type without phase compensating mechanism, it has been found that the inventive device produces a sound pressure which is higher by about 16 dB than that of the well known device.

According to the inventive piezoelectric sound generator incorporating a phase shifting mechanism, an efficient conversion from electric signal to sound can be attained by the adjustment of the phase difference, and the piezoelectric transducer can be oscillated at a frequency at which a maximum sound pressure can be obtained.

Though the present invention has been described with reference to the preferred embodiment thereof, many modifications and alterations may be made within the spirit of the invention.

What is claimed is:

1. A piezoelectric audible sound generator comprising:

a self oscillator including a piezoelectric transducer which includes inherent equivalent capacitance between first and second electrodes thereof, amplifier means connected to said first and second electrodes for driving said piezoelectric transducer to oscillate at a predetermined frequency and in a predetermined phase, said amplifier means including inherent bias resistance therein which when combined with said inherent capacitance, produces a phase shift between the driving frequency of said amplifier and the frequency of oscillation of said transducer, and a feedback circuit for transferring a feedback signal from a third electrode of said piezoelectric transducer to said amplifier means, and phase compensator means interposed between said third electrode and said feedback circuit for adjusting the phase shift such that said feedback signal from said third electrode is 170°–190° out of phase relative to a signal from said driving electrode.

2. A piezoelectric audible sound generator according to claim 1, in which said amplifier means has a first transistor having a collector connected to a resistor for receiving a source of power and to said first electrode for driving said transducer, an emitter connected to ground, and a base connected to a base biasing resistor being coupled to said collector, said base being connected through a base resistor to said feedback circuit.

3. A piezoelectric audible sound generator according to claim 1, in which said phase compensator means includes a network composed of a variable resistor and at least a single capacitor, said network including means connected to said feedback circuit for producing a feedback signal, said variable resistor being connected to said capacitor and operative to effect variations in the magnitude of said feedback signal thereby to adjust the phase shift.

4. The piezoelectric audible sound generator according to claim 2, in which said phase compensator has:

a. a second transistor having a base connected to said third electrode, a collector connected to said power source, and an emitter connected to ground, b. a third transistor having a base connected through two capacitor means to the collector of said second transistor, and c. variable resistor means connected between said emitter of said second transistor and one of said two capacitor means said feedback circuit interconnecting the collector of said third transistor and said amplifier means.

5. The piezoelectric audible sound generator according to claim 4, in which said variable resistor means is a semi-fixed resistor.

* * * * *